(12) United States Patent
Christensen et al.

(10) Patent No.: US 10,751,795 B2
(45) Date of Patent: Aug. 25, 2020

(54) NANOSTRUCTURED COMPOSITE METAL HYDRIDES

(71) Applicant: Alliance for Sustainable Energy, LLC, Golden, CO (US)

(72) Inventors: Steven Thomas Christensen, Golden, CO (US); Thomas Gennett, Denver, CO (US); Noemie Marius, Boulder, CO (US); Karl Joseph Gross, Alamo, CA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 191 days.

(21) Appl. No.: 15/982,232

(22) Filed: May 17, 2018

(65) Prior Publication Data

US 2018/0333774 A1    Nov. 22, 2018

Related U.S. Application Data

(60) Provisional application No. 62/507,354, filed on May 17, 2017.

(51) Int. Cl.
*B22F 1/02* (2006.01)
*C01B 3/00* (2006.01)
(Continued)

(52) U.S. Cl.
CPC ............. *B22F 1/02* (2013.01); *B22F 1/0018* (2013.01); *C01B 3/0026* (2013.01); *C01B 3/0031* (2013.01); *C01B 3/0068* (2013.01); *C01B 3/0078* (2013.01); *C23C 16/403* (2013.01); *C23C 16/405* (2013.01); *C23C 16/4417* (2013.01); *C23C 16/45525* (2013.01); *C23C 16/45555* (2013.01); *B22F 1/0025* (2013.01); *B22F 1/0048* (2013.01); *B22F 2301/10* (2013.01); *B22F 2301/25* (2013.01); *B22F 2302/253* (2013.01); *B22F 2302/256* (2013.01);
(Continued)

(58) Field of Classification Search
CPC ................................. B22F 1/02; C01B 3/0031
USPC ............................................................. 75/244
See application file for complete search history.

(56) References Cited

U.S. PATENT DOCUMENTS 8,338,330 B2 * 12/2012 Yang ....................... C01B 3/001
                                                                    428/408
8,673,804 B2    3/2014 Martens et al.
(Continued)

FOREIGN PATENT DOCUMENTS

WO    WO 2005/014469 A1    2/2005
WO    WO 2012/054766 A2    4/2012

OTHER PUBLICATIONS

Lu et al., "Coking- and Sintering-Resistant Palladium Catalysts Achieved Through Atomic Layer Deposition", Science, Mar. 9, 2012, vol. 335, pp. 1205-1208 (Year: 2012), Provided by the applicant.*

(Continued)

*Primary Examiner* — Weiping Zhu
(74) *Attorney, Agent, or Firm* — Michael A. McIntyre

(57) ABSTRACT

The present disclosure relates to a composition that includes a solid core having an outer surface and a coating layer, where the coating layer covers at least a portion of the outer surface, the coating layer is permeable to hydrogen ($H_2$), and the solid core is capable of reversibly absorbing and desorbing hydrogen.

20 Claims, 11 Drawing Sheets

(51) Int. Cl.
    *C23C 16/455* (2006.01)
    *C23C 16/40* (2006.01)
    *B22F 1/00* (2006.01)
    *C23C 16/44* (2006.01)

(52) U.S. Cl.
    CPC ....... *B22F 2302/40* (2013.01); *B22F 2303/20* (2013.01); *B22F 2304/054* (2013.01); *B22F 2304/058* (2013.01); *B22F 2304/10* (2013.01)

(56) References Cited

U.S. PATENT DOCUMENTS

| | | | |
|---|---|---|---|
| 2013/0034472 | A1 | 2/2013 | Cantrell et al. |
| 2013/0266878 | A1* | 10/2013 | Vajo ........................ C01B 3/001 429/421 |
| 2019/0345090 | A1 | 11/2019 | Vardon et al. |
| 2020/0061598 | A1 | 2/2020 | Vardon et al. |

OTHER PUBLICATIONS

Argyle et al., "Heterogeneous Catalyst Deactivation and Regeneration: A Review," Catalysis, 2015, vol. 5, pp. 145-269.
Baktash et al., "Alumina coated nickel nanoparticles as a highly active catalyst for dry reforming of methane," Applied Catalysis B: Environmental, 2015, vol. 179, pp. 122-127.
Bardham et al., "Uncovering the intrinsic size dependence of hydriding phase transformations in nanocrystals," Nature Materials, Oct. 2013, vol. 12, pp. 905-912.
Camacho-Bunquin et al., "Catalyst synthesis and evaluation using an integrated atomic layer deposition synthesis-catalysis testing tool," Review of Scientific Instruments, 2015, vol. 86, pp. 084103-1 through 084103-7.
Caruso et al., "Nanoengineering of Inorganic and Hybrid Hollow Spheres by Colloidal Templating," Science, vol. 282, Nov. 6, 1998, pp. 1111-1114.
Clemens, "Summary and Highlights from Project A: Destabilized Hydrides," Sandia National Laboratories, Sandia Report, Final Report for the DOE Metal Hydride Center of Excellence, Feb. 2012, pp. 37-46.
Dasgupta et al., "Atomic Layer Deposition of Metal Sulfide Materials," Accounts of chemical research, Jan. 12, 2015, vol. 48, pp. 341-348.
Dasgupta et al., "Recent Advances in Atomic Layer Deposition," Chemistry of Materials, Apr. 12, 2016, vol. 28, pp. 1943-1947.
Dobbins et al., "Nanoarchitecture of Protective Coatings for Air Sensitive Metal Hydrides," Aldrich, Material Matters, Chemistry Driving Performance, Hydrogen Storage Materials, 2007, vol. 2, No. 2, pp. 19-21.
Feng et al., "Alumina Over-coating on Pd Nanoparticle Catalysts by Atomic Layer Deposition: Enhanced Stability and Reactivity," Springer Catal. Lett., 2011, vol. 141, pp. 512-517.
Gharachorlou et al., "Surface Chemistry of Trimethylaluminum on Pd(111) and Pt(111)," Journal of Physical Chemistry C, 2015, vol. 119, pp. 19059-19072.
Gong et al., "Atomic Layer Deposition of Alumina Passivation Layers in High-Aspect-Ratio Tubular Reactors for Coke Suppression during Thermal Cracking of Hydrocarbon Fuels," ACS I&EC Research, 2015, vol. 54, pp. 3746-3753.
Gould et al., "Stabilizing Ni Catalysts by Molecular Layer Deposition for Harsh, Dry Reforming Conditions," ACS Catalysis, 2014, vol. 4, pp. 2714-2717.
Gregorczyk et al., "Hybrid nanomaterials through molecular and atomic layer deposition: Top down, bottom up, and in-between approaches to new materials," Progress in Materials Science, 2016, vol. 75, pp. 1-37.
Heroguel et al., "Improving Heterogeneous Catalyst Stability for Liquid-phase Biomass Conversion and Reforming," The Swiss Competence Center for Energy Research on Bioenergy, CHIMIA 2015, vol. 69, No. 10, pp. 582-591.
Jackson et al., "Tuning Acid-Base Properties Using Mg—Al Oxide Atomic Layer Deposition," 2015, Applied Materials & Interfaces, vol. 7, pp. 16573-16580.
Jeon et al., "Air-stable magnesium nanocomposites provide rapid and high-capacity hydrogen storage without using heavy-metal catalysts," Nature Materials, Apr. 2011, vol. 10, pp. 286-290.
Lei et al., "Synthesis of Pt—Pd Core-Shell Nanostructures by Atomic Layer Deposition: Application in Propane Oxidative Dehydrogenation to Propylene." Chemistry of Materials, 2012, vol. 24, pp. 3525-3533.
Liang et al., "Stabilization of Supported Metal Nanoparticles Using an Ultrathin Porous Shell," ACS Catalysis, 2011, vol. 1, pp. 1162-1165.
Liz-Marzan et al., "Synthesis of Nanosized Gold-Silica Core-Shell Particles," Langmuir, 1996, vol. 12, pp. 4329-4335.
Lu et al., "Coking- and Sintering-Resistant Palladium Catalysts Achieved Through Atomic Layer Deposition," Science, Mar. 9, 2012, vol. 335, pp. 1205-1208.
Lu et al., "Porous Alumina Protective Coatings on Palladium Nanoparticles by Self-Poisoned Atomic Layer Deposition," Chemistry of Materials, 2012, vol. 24, pp. 2047-2055.
Lu et al., "First-Principles Predictions and in Situ Experimental Validation of Alumina Atomic Layer Deposition on Metal Surfaces," Chemistry of Materials, 2014, vol. 26, pp. 6752-6761.
McDaniel et al., "Atomic layer deposition of perovskite oxides and their epitaxial integration with Si, Ge, and other semiconductors," Applied Physics Reviews 2, 2015, pp. 041301-1 through 041301-32.
O'Neill et al., "Stabilization of Copper Catalysts for Liquid-Phase Reactions by Atomic Layer Deposition," Angewandte Chemie, 2013, vol. 125, pp. 14053-14057.
O'Neill et al., "Catalyst Design with Atomic Layer Deposition," ACS Catalysis, Feb. 6, 2015, vol. 5, pp. 1804-1825.
Onn et al., Improved Thermal Stability and Methane-Oxidation Activity of $Pd/Al_2O_3$ Catalysts by Atomic Layer Deposition of $ZrO_2$, ACS Catalysis, 2015, vol. 5, pp. 5696-5701.
Schüth et al., "Ammonia as a possible element in an energy infrastructure: catalysts for ammonia decomposition," Energy & Environmental Science, 2012, vol. 5, pp. 6278-6289.
Young et al., "Growth and Characterization of $Al_2O_3$ Atomic Layer Deposition Films on sp2-Graphitic Carbon Substrates Using $NO_2$/Trimethylaluminum Pretreatment," Applied Materials & Interfaces, May 12, 2015, vol. 7, 12030-12037.
Zhang et al., "Atomic Layer Deposition Overcoating: Tuning Catalyst Selectivity for Biomass Conversion," Angewandte Communications, International Edition, 2014, vol. 53, pp. 12132-12136.
Zhang et al., "Enhancing the stability of copper chromite catalysts for the selective hydrogenation of furfural with ALD overcoating (II)—Comparison between TiO2 and Al2O3 overcoatings," Elsevier Journal of Catalysis, 2015, vol. 326, pp. 172-181.

* cited by examiner

NANOSTRUCTURED COMPOSITE METAL HYDRIDES

CROSS-REFERENCE TO RELATED APPLICATIONS

This application claims the benefit of U.S. Provisional Patent Application No. 62/507,354 filed May 17, 2017, the contents of which are incorporated herein by reference in their entirety.

CONTRACTUAL ORIGIN

The United States Government has rights in this invention under Contract No. DEAC36-08GO28308 between the United States Department of Energy and Alliance for Sustainable Energy, LLC, the Manager and Operator of the National Renewable Energy Laboratory.

BACKGROUND

The present disclosure relates to nanostructured composite metal hydrides. In particular, the present disclosure provides methods for fabricating hydrogen storage materials such as metal hydrides having hydrogen absorption/desorption kinetics that are suitable for transportation applications.

Metal borohydrides have been considered for many years as a potential hydrogen storage material because of their high hydrogen volume and weight capacities. For example, $Mg(BH_4)_2$ possesses a very high volumetric density and sets the record (14.9 wt %) for the gravimetric capacity of a reversible metal hydride system. The change in enthalpy ($\Delta H$) for hydrogen desorption for this material is approximately ~40 kJ/mole $H_2$, which is not far from the ideal value of $\Delta H$ of 27 kJ/mol $H_2$. However, hydrogen sorption is kinetically limited, and the temperatures required for significant hydrogen desorption are around 300° C. Reaction pathways appear to have important consequences for both kinetics and reversibility. Thus, there remains a need for advanced solid materials having improved capacities and reaction kinetics for the storage of $H_2$ in order to advance technologies utilizing $H_2$ as a renewable fuel.

SUMMARY

An aspect of the present disclosure is a composition that includes a solid core having an outer surface and a coating layer, where the coating layer covers at least a portion of the outer surface, the coating layer is permeable to hydrogen ($H_2$), and the solid core is capable of reversibly absorbing and desorbing hydrogen. In some embodiments of the present disclosure, the solid core may have a characteristic diameter between greater than zero nanometers and 5000 nm. In some embodiments of the present disclosure, the solid core may include at least one of a hydride and/or a metal. In some embodiments of the present disclosure, the metal may include at least one of palladium, platinum, nickel, iridium, ruthenium, copper, silver, gold, and/or osmium. In some embodiments of the present disclosure, the solid core may further include a substrate, where the metal may be positioned on the substrate. In some embodiments of the present disclosure, the substrate may include at least one of activated carbon, aluminum oxide, silicon dioxide, and/or magnesium diboride. In some embodiments of the present disclosure, the substrate may be activated carbon. In some embodiments of the present disclosure, the metal may be palladium.

In some embodiments of the present disclosure, the hydride may include a metal. In some embodiments of the present disclosure, the hydride may include at least one of magnesium hydride ($MgH_2$), $TiH_2$, aluminum hydride ($AlH_3$), lanthanum nickel hydride ($LaNi_5H_7$), and/or lithium aluminum hydride ($LiAlH_4$). In some embodiments of the present disclosure, the hydride may include boron. In some embodiments of the present disclosure, the hydride may include at least one of magnesium borohydride ($Mg(BH_4)_2$), ammonia borane ($NH_3BH_3$), aluminum borohydride ($Al(BH_4)_2$), calcium borohydride ($Ca(BH_4)_2$), magnesium diboride ($MgB_2$), sodium borohydride ($NaBH_4$), and/or lithium borohydride ($LiBH_4$). In some embodiments of the present disclosure, the coating layer may have a thickness between greater than zero nanometers and 50 nm. In some embodiments of the present disclosure, the coating layer may include one or more layers deposited by atomic layer deposition (ALD). In some embodiments of the present disclosure, the coating layer may include at least one of MgO, $SnO_2$, $SiO_2$, ZnS, $Al_2O_3$, $CeO_2$, $Nb_2O_5$, $ZrO_2$, $CeO_2$, and/or $TiO_2$. In some embodiments of the present disclosure, the composition may further include a particle, where the particle is positioned on the outer surface, and the coating substantially covers the particle. In some embodiments of the present disclosure, the composition may further include hydrogen.

An aspect of the present disclosure is a method that includes loading hydrogen ($H_2$) onto a storage material, where the storage material includes a solid core and a coating layer. The method further includes releasing the hydrogen from the storage material, where the loading and releasing are reversibly cycled between the loading and the releasing, the storage material, after the loading, contains a concentration of the hydrogen of up to 10 wt %, and the storage material, after the releasing, contains a concentration of the hydrogen of less than 10 wt %. In some embodiments of the present disclosure, the storage material may be capable of being reversibly cycled between the loading and the releasing at least three times. In some embodiments of the present disclosure, the storage material may be capable of being reversibly cycled between the loading and the releasing at least one hundred times.

BRIEF DESCRIPTION OF THE DRAWINGS

Some embodiments of the present disclosure are illustrated in referenced figures of the drawings. It is intended that the embodiments and figures disclosed herein are to be considered illustrative rather than limiting.

REFERENCE NUMBERS

Figure 1:
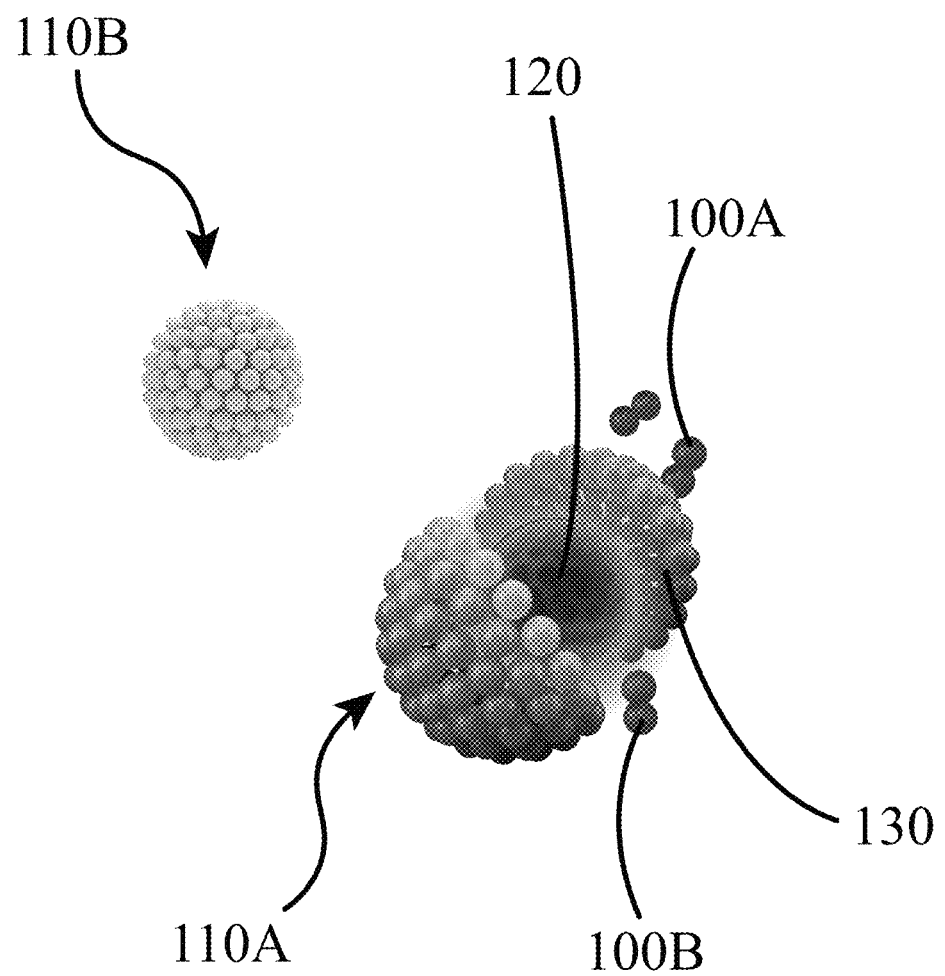
FIG. 1 illustrates a conceptual diagram of a reversible hydrogen storage material, according to some embodiments of the present disclosure.

| | |
|---|---|
| 100 | hydrogen ($H_2$) |
| 110 | storage material |
| 120 | solid core |
| 130 | coating layer |
| 200 | particle |
| 300 | method |
| 310 | loading |
| 320 | releasing |

DETAILED DESCRIPTION

At present, solid-state reversible hydrogen storage materials are not able to attain hydrogen storage targets for both volumetric (40 g $H_2$/L system) and gravimetric capacity (5.5 g $H_2$/kg system) at practical temperatures, pressures, and rates. Some embodiments of the present disclosure have the potential to surpass these targets. Common hydrogen storage goals assume that hydrogen will be delivered and recharged efficiently by the storage technology. The current major drawbacks are that the metal borohydrides must be regenerated off-board because of the conditions necessary for hydrogen absorption, and that while some hydrogen is available at temperatures below 200° C., i.e., 2% w/w, the remainder is not typically released until temperatures in excess of 300° C. are reached. Therefore, some embodiments of the present disclosure improve the rates of hydrogen release, even at lower temperatures, and allow for an alternative pathway that does not result in irreversible reactions.

Typically, hydrogen uptake and release kinetics, temperature, pressure, cyclability, and reaction pathways (thermodynamics) have limited metal borohydride technology readiness and have slowed its advance to the next stages of commercial use. In addition, nuclear magnetic resonance (NMR) has identified a potential intermediate phase that includes $B_{12}H_{12}$ as a potential hindrance to reversable hydrogen storage. This phase may be more stable than the desired boride phase, for the example of a borohydride solid core and, thus, may explain the loss in capacity with cycling. Thus, high hydrogen absorption temperatures and pressures may result in poor kinetics and reversibility losses due to undesirable phase formation in the hydrogen storage material, as described above. According to some embodiments of the present disclosure, these issues may be addressed by reducing and maintaining particle sizes of the storage materials, to less than a few hundred nanometers and/or by adding hydrogenation catalysts. These factors may improve kinetics by shortening the distances active species (H, B, and/or M) need to travel by diffusion and/or convective mass-transfer to the solid core and/or within the solid core. Without wishing to be bound by theory, this may enable the use of lower temperatures for hydrogen storage and/or release and may result in more reasonable $H_2$ discharge rates and recharge rates, with the additional benefit of reducing or eliminating undesirable reaction pathways. Thus, according to some embodiments of the present disclosure, the ability to control reaction pathways by encapsulation of a solid core of a hydrogen storage material with at least one outer coating layer may prevent the formation of $B_{12}H_{12}$ intermediate phases and other undesirable phases in hydrogen storage materials containing metal borohydride solid cores. In addition, some embodiments of the present disclosure employ ALD to provide at least one coating layer to at least a portion of the outer surface of the solid core of a storage material, to ensure that both the nanostructured morphology and the catalyst dispersion are retained to promote rapid discharging (releasing) from the storage material, and recharging (loading) of hydrogen onto/into the storage material. This ALD-enabled encapsulation technology may improve the kinetics, operating temperatures, and cycle-life capacity to advance the capabilities of hydrogen storage materials.

FIG. 1 illustrates a conceptual diagram of a reversible hydrogen storage material 110, according to some embodiments of the present disclosure. Some embodiments of the storage material 110 (two individual examples are shown in FIG. 1; 110A and 110B) are based on atomic layer deposition (ALD) encapsulation of nanostructured materials, e.g. nanostructured metal borohydrides (NMBHs). The ALD process, as described herein, for producing the storage material 110 ensures that the initial nanostructured storage material morphology of a solid core 120 is retained after application of a coating layer 130 by ALD, to maintain and/or promote rapid discharging and recharging of hydrogen into and out of the resultant final hydrogen storage material 110. Referring again to FIG. 1, the storage material 110 includes a solid core 120 covered by at least one coating layer 130, where the coating layer 130 at least partially covers the outer surface of the solid core 120, and the coating layer 130 is deposited by at least an ALD method. In some embodiments of the present disclosure, the coating layer 130 may completely cover the entire outer surface of the solid core 120, such that the solid core is not directly exposed to the external environment. As shown in FIG. 1, hydrogen ($H_2$) 100 (two $H_2$ molecules shown; 100A and 100B) may reversibly diffuse through the coating layer 130 to the outer surface of the solid core 120. In some embodiments of the present disclosure, the hydrogen 100 may be absorbed by at least a portion of the mass of the solid core 120 of the storage material 110; e.g. absorption of the hydrogen 100 may occur in internal surfaces (not shown) of the solid core 120 and/or to the external surfaces of the solid core 120.

Some advantages of ALD over other encapsulation/coating methods (e.g., intercalation or deposition of the hydride into a highly porous media) include: (1) ALD coats the solid core 120, limiting access to the solid core 120 of the storage material 110 to primarily, if not exclusively, hydrogen 100, and (2) ALD is a self-limiting reaction where only one atomic layer of the coating layer 130 may be applied at a time, such that the coating layer 130 can be accurately controlled to achieve a specific target thickness and/or to minimize the coating layer 130 to a small fraction of the storage material's total weight and/or volume.

Some embodiments of the present disclosure may improve the hydrogen storage and/or storage properties of storage materials containing metal borohydride solid cores, and possibly other solid cores and/or other hydride materials. This may be achieved by, (1) retaining a solid core having a nanoscale characteristic length/diameter (e.g. <100 nm) to improve kinetics; (2) modifying reaction pathways by maintaining short reactant mobility distances to reduce or eliminate capacity loss by the formation of unwanted irreversible phases; (3) providing at least one coating layer that behaves as a protective layer that resists degradation from physical degradation, caused by for example, sintering, and that also resists degradation due to chemical breakdown, for example, by oxidation; and (4) providing at least one coating layer that behaves as a kinetic layer that may include, for example, a catalyst material capable of enhancing the kinetic pathways of absorption of hydrogen onto/into the solid core and/or desorption from the solid core. In some embodiments of the present disclosure, a single coating layer may provide the benefits of both a protective layer and a kinetic layer. In some embodiments of the present disclosure, a coating layer may only provide protective characteristics or only provide kinetic characteristics.

Figure 2:
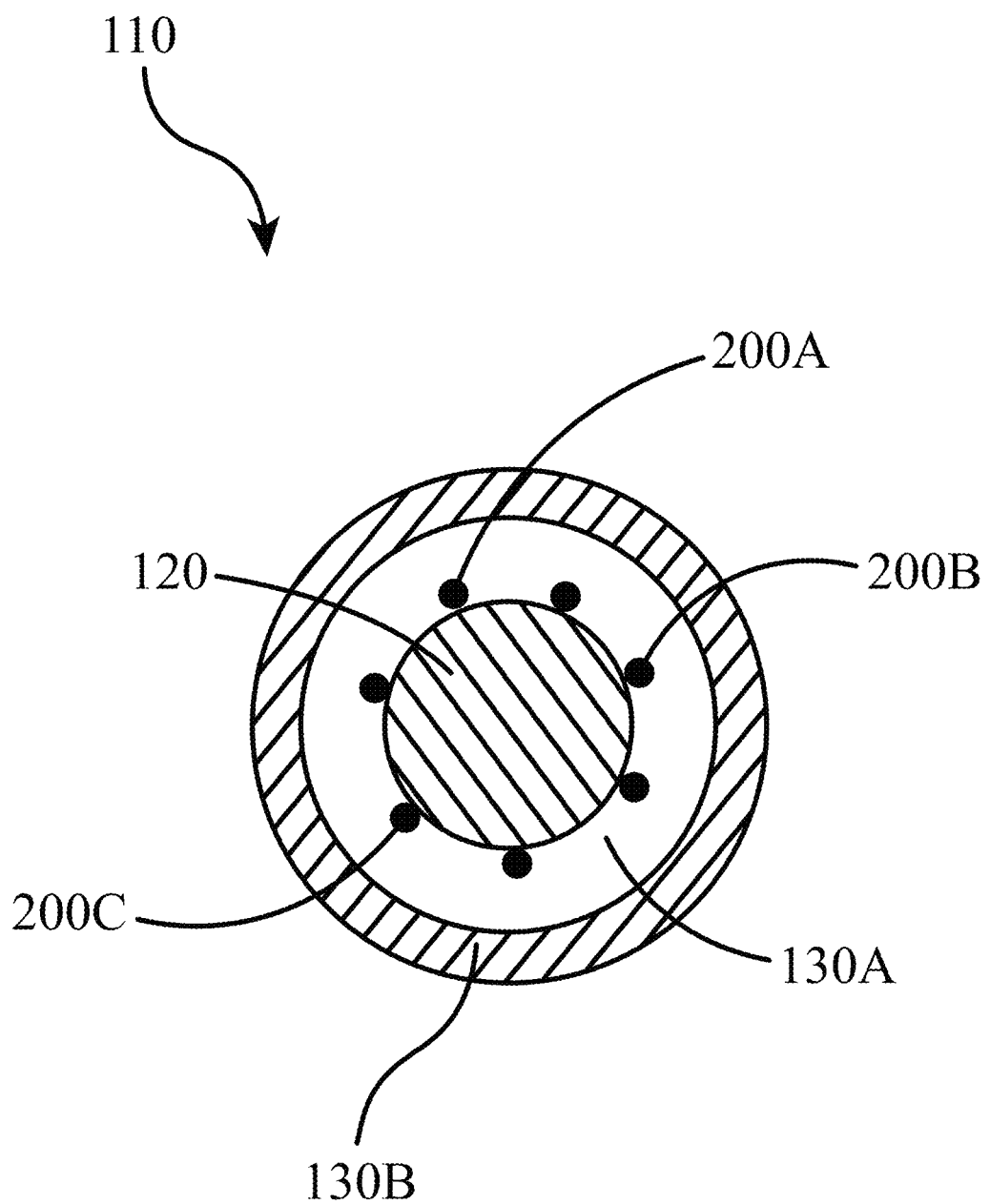
FIG. 2 illustrates a storage material for reversibly loading and storing hydrogen ($H_2$) in at least a portion of the storage material, and reversibly releasing the hydrogen from the storage material, according to some embodiments of the present disclosure.

FIG. 2 illustrates a hydrogen storage material 110 for reversibly loading and storing hydrogen ($H_2$) in at least a portion of the storage material 110, and releasing the hydrogen from the storage material, according to some embodiments of the present disclosure. As described above, the hydrogen storage material 110 includes a solid core 120 at least partially covered by at least one coating layer 130. In the example of FIG. 2, a first coating layer 130A is in direct physical contact with the solid core 120, and the first coating layer 130A is at least partially covered by a second coating layer 130B. In some embodiments of the present disclosure, a coating layer 130, may completely cover the entire outer surface of the solid core 120, or a coating layer 130 may partially cover the outer surface of solid core 120. A single coating layer 130 may be deposited by a single ALD deposition or by one or more successive ALD deposition cycles. In general, as defined herein, a coating layer 130 is defined by its elemental composition. In some embodiments of the present disclosure, a hydrogen storage material 110 may include a particle 200 (or plurality of particles; 200A, 200B, 200C) positioned on the surface of the solid core 120. Thus, in some embodiments, a particle 200 may be positioned at the interface between the surface of the solid core 120 and a first coating layer 130A, as shown in FIG. 2. However, a particle 200 may be positioned on the outer surface of the first coating layer 130A, where it is subsequently covered by the second coating layer 130B. In still other examples, a particle 200 may be positioned within a coating layer 130. A particle 200 may provide protective attributes and/or kinetic attributes as described herein.

In some embodiments of the present disclosure, a solid core 120 may have a characteristic length and/or diameter between greater than zero nanometers and 5000 nm, or between greater than 1 nm and 50 nm, inclusively. A solid core 120 may have at least one of a spherical shape, cylindrical shape, amorphous particulate shape, and/or any other suitable shape. A solid core 120 may be constructed of a composition capable of reversibly storing and releasing hydrogen, where the composition is substantially a single solid phase or more than one solid phase. For example, a solid core 120 may be constructed of at least one of a metal hydride, a metal borohydride, a chemical hydride, Mg($BH_4$)$_2$, $MgH_2$, $TiH_2$, aluminum hydride, $NH_3BH_3$, lanthanum nickel hydride, Al($BH_4$)$_2$, Ca($BH_4$)$_2$, $MgB_2$, palladium, sodium borohydride, lithium aluminum hydride, lithium borohydride, and others. In some embodiments of the present disclosure, the solid core 120 may be crystalline, amorphous, or a combination thereof. In some embodiments of the present disclosure, the solid core 120 may be constructed of a substantially inert substrate (e.g. activated carbon, aluminum oxide, silicon dioxide, magnesium diboride), with a solid phase capable of reversibly storing and releasing hydrogen (e.g. palladium) positioned on surfaces of the inert substrate and/or in the internal volume of the inert substrate. A coating layer 130 may be constructed of at least one oxide such as MgO, $SnO_2$, $SiO_2$, ZnS, $Al_2O_3$, $CeO_2$, $Nb_2O_5$, $ZrO_2$, and/or $TiO_2$. A coating layer 130 may be constructed from an organic, and/or a hybrid organic-inorganic material (e.g. —Al—($C_2H_4$)$_n$—Al—) via molecular layer deposition which is a subset of atomic layer deposition that substitutes alcohols as an ALD precursor. A coating layer 130 may have a thickness between greater than zero nanometers and 50 nm, or between 0.1 nm and 10 nm. A coating layer 130 may completely cover its underlying element (e.g. solid core 120, another coating layer 130, and/or a particle 200), or it may only partially cover its underlying element, such that the coating layer 130 is present as individual islands and/or interconnected islands of the coating layer 130, interspersed with exposed areas of the underlying element. A particle 200, included for example to provide improved physical properties and/or performance characteristics of the hydrogen storage material 110, may include at least one of Pd, Pt, Ni, Ir, Ru, Cu, Ag, Au, Os, La, Sc, Ti, and/or Ce. Such particles 200 may have a characteristic length/diameter of between greater than zero nanometers and 10 nm, or between 0.1 nm and 2 nm. Particles 200 may have at least one of a spherical shape, cylindrical shape, amorphous particulate shape, and/or any other suitable shape.

Figure 3:
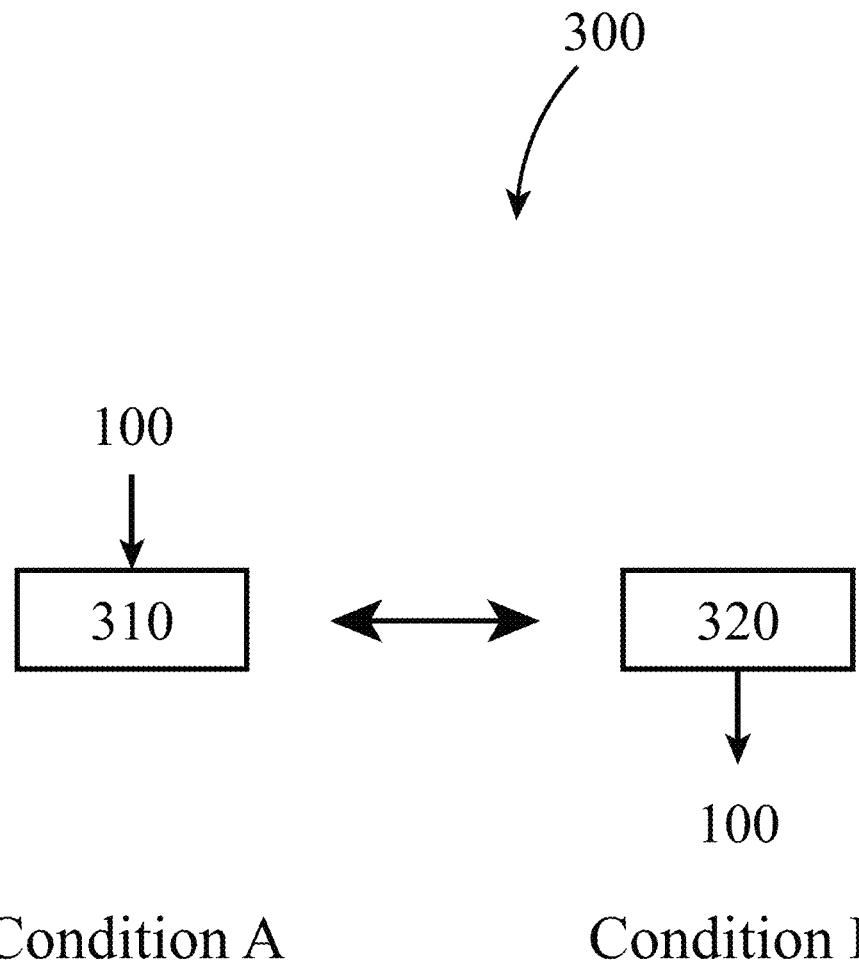
FIG. 3 illustrates a method for reversibly loading and storing hydrogen ($H_2$) in a storage material, and releasing the hydrogen from the storage material, according to some embodiments of the present disclosure.

FIG. 3 illustrates a method 300 for reversibly loading and storing hydrogen ($H_2$) 100 in a storage material (not shown), and releasing the hydrogen 100 from the storage material, according to some embodiments of the present disclosure. In some embodiments of the present disclosure, when the storage material meets a first condition, Condition A, the method 300 may proceed with the loading 310 of hydrogen 100 onto/into the storage material. Next, when the stored hydrogen is needed, the method 300 may proceed with the releasing 320 of the hydrogen 100 from the storage material, when a second condition, Condition B, is met. Table 1 below provides target conditions for Condition A and Condition B for some embodiments of hydrogen storage materials as described herein, for loading 310 hydrogen and releasing 320 hydrogen using these storage materials.

TABLE 1

Preferred Parameters for Conditions A and B
(Basis: 5 kg of hydrogen)

|  | Loading 310 | Release 320 |
| --- | --- | --- |
| Temperature (° C.) | 200 | 85 |
| Pressure (bar) | 100 | 10 |
| Time (min) | 5 | NA |
| Flow rate (g $H_2$/s) | NA | 0.02 |

In some embodiments of the present disclosure, the solid core may include discrete particles that demonstrate nano-size-induced kinetic enhancements with respect to the bulk material. These effects have been observed beginning at ~50 nm average size for nanoparticles and/or confinement in nanoporous scaffolds (e.g. where the solid core is confined within a pore of another solid material). The $H_2$ permeable encapsulation technology may then 'lock in' the enhanced kinetic behavior by maintaining short reaction distances, preventing particle agglomeration, and protecting against degradation by gas impurities. The solid core may be fabricated by ball milling methods and/or any other suitable technology for producing particles and/or powders. According to some embodiments of the present disclosure, the solid core may include a metal borohydride material such as $Mg(BH_4)_2$. Other metal borohydride materials may also be used as the solid core of a hydrogen storage material, such as $MgH_2$, $Al(BH_4)_3$, and/or $Ca(BH_4)_2$.

In some embodiments of the present disclosure, a coating layer may protect against degradation of kinetics and $H_2$ capacity due to undesirable reaction pathways. For example, the coating layer may play a key role in maintaining the rapid kinetics needed and cyclability needed for onboard hydrogen storage, for example in vehicles. Kinetic mechanisms that rely on nanostructured morphology can break down due to thermal cycling that can alter diffusion pathways and/or cause particle sintering. Thus, a coating layer may provide a gas permeable coating that prevents or minimizes these physical changes.

A protective coating layer covering the solid core of a hydrogen storage material may also control reactive pathways by passivating defect sites on the solid core, e.g. a metal borohydride, that may promote undesirable reaction mechanisms for both absorption/desorption and oxidation. Defect sites such as vacancies, step edges, and dislocations exhibit high chemical activity that may affect hydrogen reaction pathways and chemical attack (oxidation). Thus, a coating layer positioned on the solid core may selectively passivate these sites and control the exposed solid core surfaces.

A coating layer may be tailored according to a specific need. For example, for the case of a protective coating layer, one may need to take into account how the material responds to the physical changes due to hydrogen absorption into the storage material and/or hydrogen desorption from the storage material. Structure-property relationships related to volume changes and hydrogen diffusion may be used to identify the degree to which absorption/desorption can occur while maintaining a functional and physically intact coating layer. Some examples of materials that may be used for coating layers have protective properties include $MgO$, $SnO_2$, $SiO_2$, $ZnS$, $Al_2O_3$, $CeO_2$, $Nb_2O_5$, $ZrO_2$, and/or $TiO_2$.

Similarly, a coating layer may be tailored so as to have properties that are favorable to reducing operating temperatures, pressures, and/or hydrogen absorption/desorption time frames through chemical additives (e.g. catalysts). A coating layer having such "kinetic" advantages may include multiple materials that take the form of supported particles (e.g. nanoparticles, partial layers, and/or very thin coatings. In some embodiments of the present disclosure, a coating layer that provides improved hydrogen storage/release kinetics may include oxides capable of being reduced (e.g. $TiO_2$, $CeO_2$, and $ZrO_2$), hydrogen dissociation catalysts, hydrogen evolution catalysts (e.g. nanoparticles of Pd, Pt, Ni, Ir, Ru, Cu, Ag, Au, and Os). In some embodiments, a coating may comprise a metal/metal oxide compound such as $Pd/CeO_2$ or $Ru/TiO_2$. In some embodiments of the present disclosure, a coating layer may possess enhanced protective and kinetic properties concurrently. Such a layer may be accomplished with a single and/or compound material in the form of nanoparticles, incomplete (partial) layers, and/or conformal coatings, where conformal means a coating having uniform coverage, without pinholes, and conforms substantially, if not completely, to the underlying substrate morphology.

Integrating a metal-oxide component into a coating layer facilitates hydrogen diffusion and catalyzes hydrogen absorption/desorption. The use of reducible metal centers such as titanium in the form of $TiCl_3$ and/or $TiCl_4$ may play a key role in lowering desorption temperatures. Hydrogen diffusion distances can be greater on $TiO_2$ than $Al_2O_3$ owing to a mechanism related to reducibility. The ALD deposition of reducible oxides places them in direct contact with the surface of the solid core of the hydrogen storage material to create improved hydrogen diffusion pathways and improve the kinetics.

A coating layer that includes a dissociation catalyst may overcome challenges with hydrogen recharging and cycling. This can be an issue for engineering metal borohydride solid cores with catalysts that exhibit low desorption temperatures and kinetics for the first cycle only. These catalysts may then provide a lower activation energy for hydrogen to react with spent metal boride material during hydrogen absorption. In some embodiments of the present disclosure, a coating layer may include up to 0.5 wt % catalysts using ALD methods. In some embodiments of the present disclosure, a nanoparticle catalyst may be positioned on the solid core and between the coating layer (e.g. metal oxide coating layer). This may be accomplished by performing ALD in a nucleation regime, employing between 1 ALD cycle and 10 ALD cycles. Selection of ALD precursors and process temperature may also be used to control the deposition rate of catalyst materials, as well as the use of surface site placeholders that limit the coverage of the ALD precursors. An example of a surface site placeholder is co-dosing a simple alcohol during the ALD cycles, where the alcohol reduces the number of surface sites on which the ALD precursors can react, resulting in less ALD material deposited and consequently smaller particle sizes while the alcohol is not permanently bound to the surface. Some examples of dissociation catalysts that may be included in the coating layer of a hydrogen storage material include nanoparticles of Pd, Pt, Ni, Ir, Ru, Cu, Ag, Au, and Os. The nanoparticles may be at the surface of the storage material core or embedded within other conformal oxide layers or decorating the surface of a functional (protective, kinetic) oxide coating (e.g. $Al_2O_3$).

Figure 4:
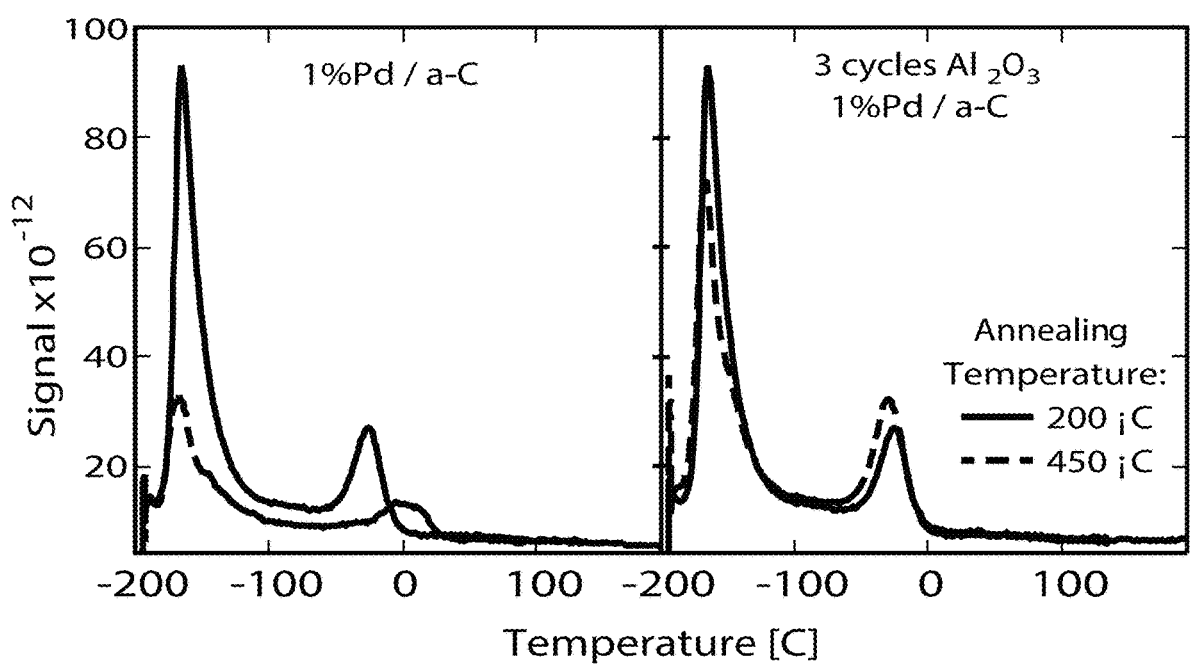
FIG. 4 illustrates data for temperature programmed desorption (TPD) of hydrogen after annealing at two different temperatures, according to some embodiments of the present disclosure.

In one example of the present disclosure, a hydrogen storage material was tested that resulted from the ALD deposition of an $Al_2O_3$ coating layer onto 1 wt % Pd on an activated carbon powder solid core (1% Pd/a-C). FIG. 4 illustrates the data for temperature programmed desorption (TPD) of hydrogen of this storage material constructed of an alumina coating on a Pd/a-C solid core after heating the storage material to a first temperature of a 200° C. followed by heating it to a second temperature of 450° C. The TPD of uncoated 1 wt % Pd/a-C solid core (left panel of FIG. 4) and the 1 wt % Pd/a-C solid core coated by ALD with alumina (right panel of FIG. 4), demonstrate similar behavior for the desorption occurring at the first temperature. However, the TPD for the second, higher temperature treatments indicate that the $Al_2O_3$ coating produced similar desorption behavior as at the lower temperature, while the uncoated material showed signs of degradation. Additional experiments (not shown) exhibited similar behavior for $Al_2O_3$ coatings on ~250 nm pure Pd powder as the solid core.

For the example of the hydrogen storage material constructed from 1% Pd/a-C as the solid core (described above), the Pd/a-C solid core was a commercially available material of Pd particles having a characteristic length between 5 nm and 10 nm, supported on the activated carbon. The sintering of Pd is a well-known problem in catalysis, and this result is quite remarkable given that the ALD of $Al_2O_3$ grows at 0.11 nm per cycle, such that the effective thickness of the final alumina coating was about 0.3 nm.

For the case of a hydrogen storage material having NMBH as the solid core, the ALD encapsulation serves, among other things, to retain the nanostructured morphology that may normally be threatened by hydrogen absorption and/or hydrogen desorption processes. Furthermore, as indicated herein, the protective coating layer does not appear to significantly impede hydrogen diffusion, either into the storage material or out of the storage material.

Figure 5:
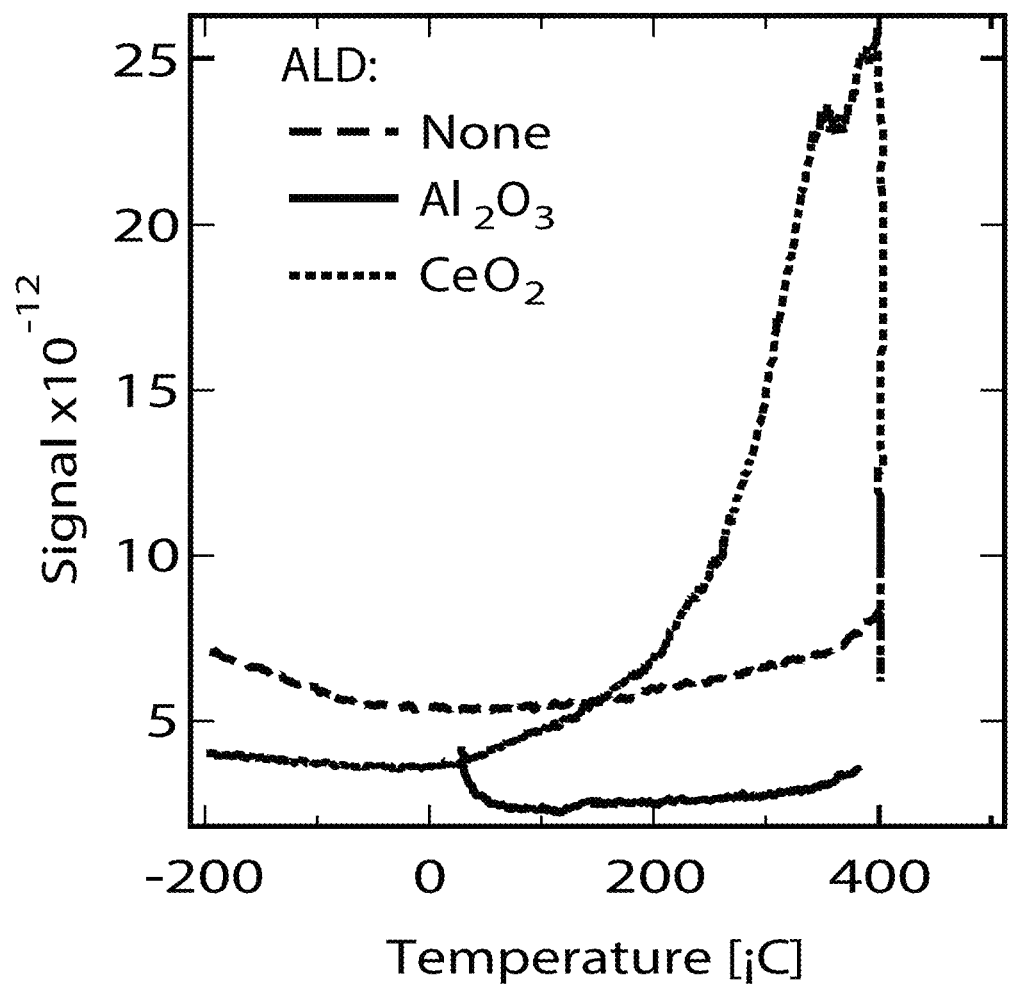
FIG. 5 illustrates TPD of hydrogen after annealing at 400° C., according to some embodiments of the present disclosure.

In another example of the present disclosure, a hydrogen storage material was produced by providing a coating layer of $CeO_2$, by ALD, onto a solid core of $MgB_2$ powder having an average particle size of about 500 nm with an irregular shape. Control samples included $Al_2O_3$ ALD-coated $MgB_2$ solid core samples and uncoated $MgB_2$ solid core samples. Adsorbed hydrogen was desorbed from these samples by initially exposing them to a temperature of about 400° C. to degas the materials, and then a reduced temperature of about 300° C. and 1.5 bar hydrogen overpressure for one hour. The sample holder was then cooled with liquid nitrogen and evacuated to $10^{-8}$ Torr. FIG. 5 illustrates the TPD of hydrogen as the samples were heated to 400° C. The hydrogen storage samples that included the $CeO_2$ coating layer on the $MgB_2$ solid core demonstrated significant $H_2$ desorption when compared to the equivalent samples not having the $CeO_2$ coating layer. These data demonstrate that the $CeO_2$-coated solid core of $MgB_2$ underwent hydrogen absorption that may be related to $CeO_2$, $MgH_2$, and/or $Mg(BH_4)_2$. Based on a characterization of the ALD-produced $CeO_2$ coating, the coating layer had an effective thickness of 0.2 nm. Accordingly, ultra-thin encapsulation of hydrogen storage materials by ALD appears to be an effective route to greatly improve metal borohydride hydrogen absorption and hydrogen desorption properties.

ALD uses self-limiting chemical reactions of precursors at a surface to deposit materials in a layer-by-layer fashion. The process uses the sequential exposure of two precursors in an ALD cycle. This vapor-based process enables significant flexibility to develop compound materials and stratified architectures by mixing different sequences of ALD cycles. ALD is a mature technology that has been extensively developed for the microelectronic industry. With respect to manufacturing, there is promise that ALD can be scaled for overcoating granular materials. ALD coating of battery powders has been validated at 200 kg/day. ALD encapsulation of metal borohydride technology may also be scaled with this strategy.

Some of the potential benefits that ALD may provide to hydrogen storage materials includes, stabilization of the nanoscale morphology, promoting chemical activity, and control of active phases. For approximately ten ALD cycles or less, incomplete coating layers may decorate high energy sites of the substrate preferentially exposing a homogeneous surface. This may promote homogeneous chemical activity that, for the example of a metal hydride, may translate into control of absorption/desorption pathways. Apparently, at least for some of the embodiments described herein, When the number of ALD overcoat exceeds ten, the surface of the solid core may become so completely encapsulated, that mass transport is so reduced as to make the hydrogen storage material of little use. In some embodiments of the present disclosure, such thicker coating layers can be made porous through heating treatments. This strategy may be used to develop a microporous coating layer for nano-encapsulation strategies of hydrogen storage materials.

Figure 6:
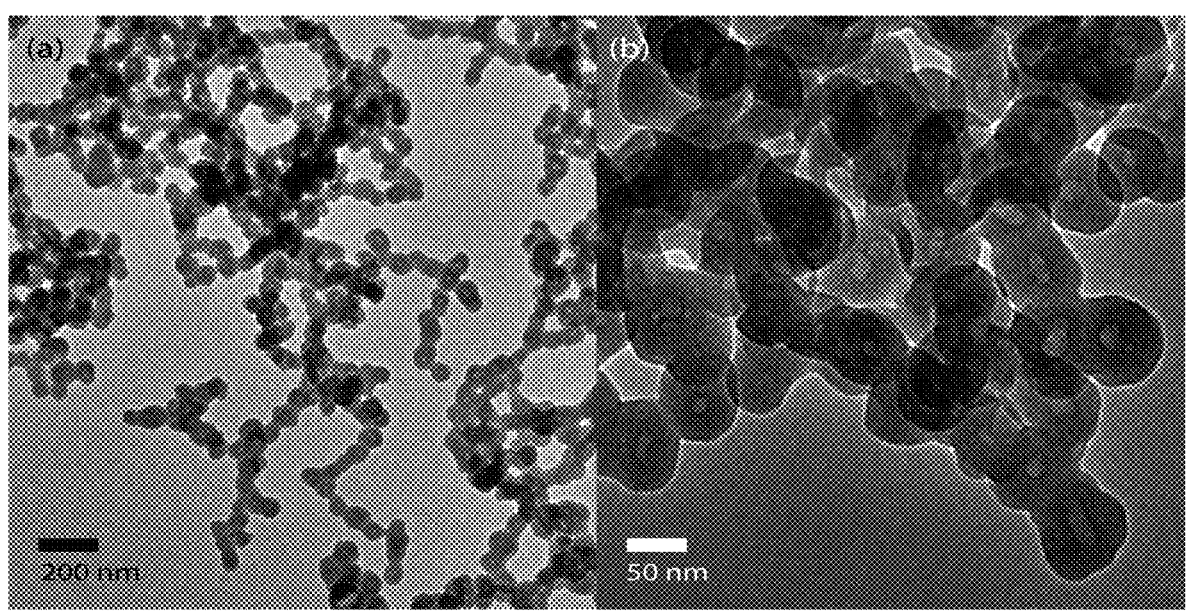
FIG. 6 illustrates TEM images of a hydrogen storage material resulting from 100 cycles of $Al_2O_3$ layer depositions on starting $Mg(BH_4)_2$ solid core particles, according to some embodiments of the present disclosure.
Figure 7:
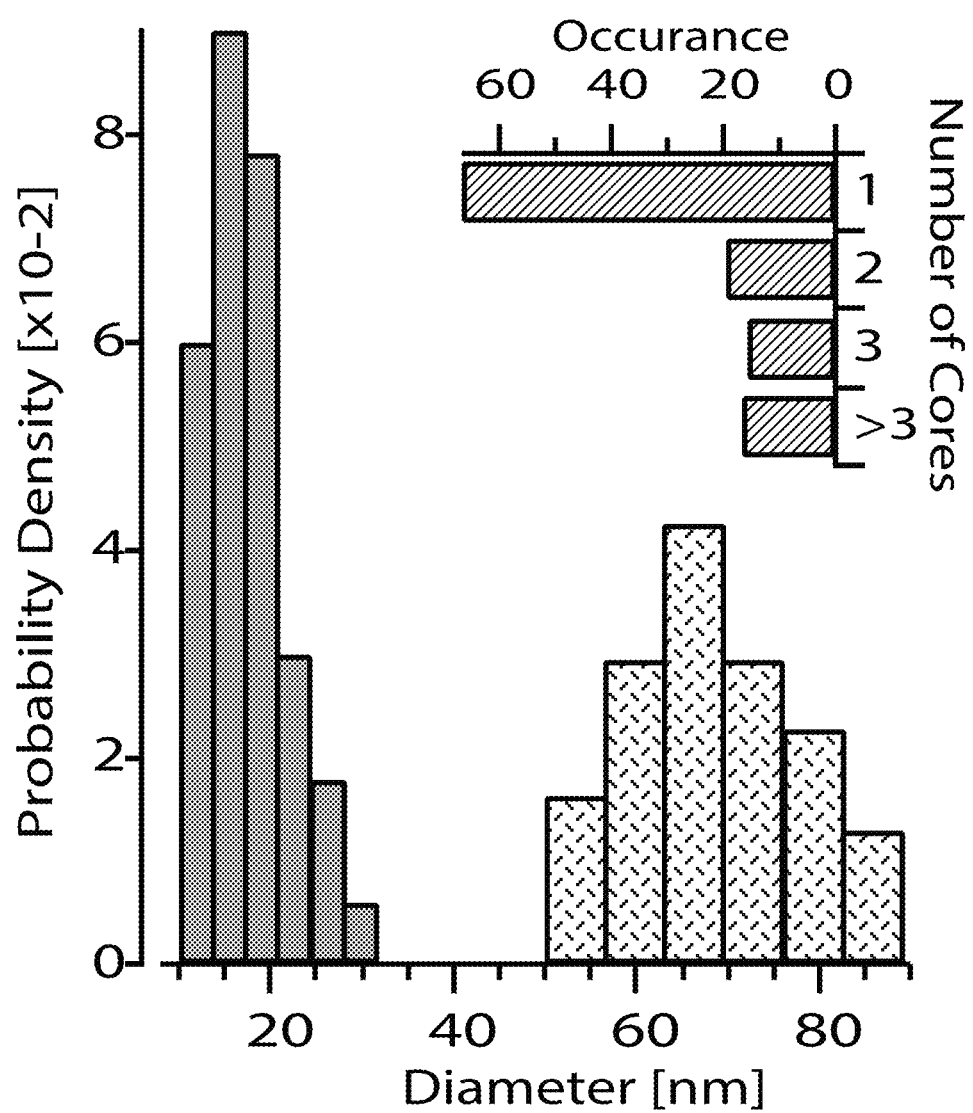
FIG. 7 illustrates particle size distribution data of the hydrogen storage material illustrated in FIG. 6, according to some embodiments of the present disclosure.

$Mg(BH_4)_2$ solid core material was prepared by Sandia National Laboratory in powder form. This material consisted of high purity γ-phase $Mg(BH_4)_2$. $Mg(BH_4)_2$ solid core particles were coated with $Al_2O_3$ using ALD, and where imaged using transmission electron microscopy (TEM). FIG. 6 shows the TEM images of the hydrogen storage material resulting from 100 cycles of $Al_2O_3$ layer depositions on the starting $Mg(BH_4)_2$ solid core particles. The images in FIG. 6 (Panels (a) and (b)) are representative of many samples wherein interconnected globular structures with a core-shell architecture were observed. Larger and more optically dense agglomerates were not observed. FIG. 7 illustrates the size distribution of the starting solid core particles (left bar graph), the size distribution of the final, coated hydrogen storage material (lower right bar graph), and number of cores within a given shell (occurrence of cores). These data provide an estimate of an effective solid core diameter of between greater than 1 nm and less than 40 nm.

Figure 8:
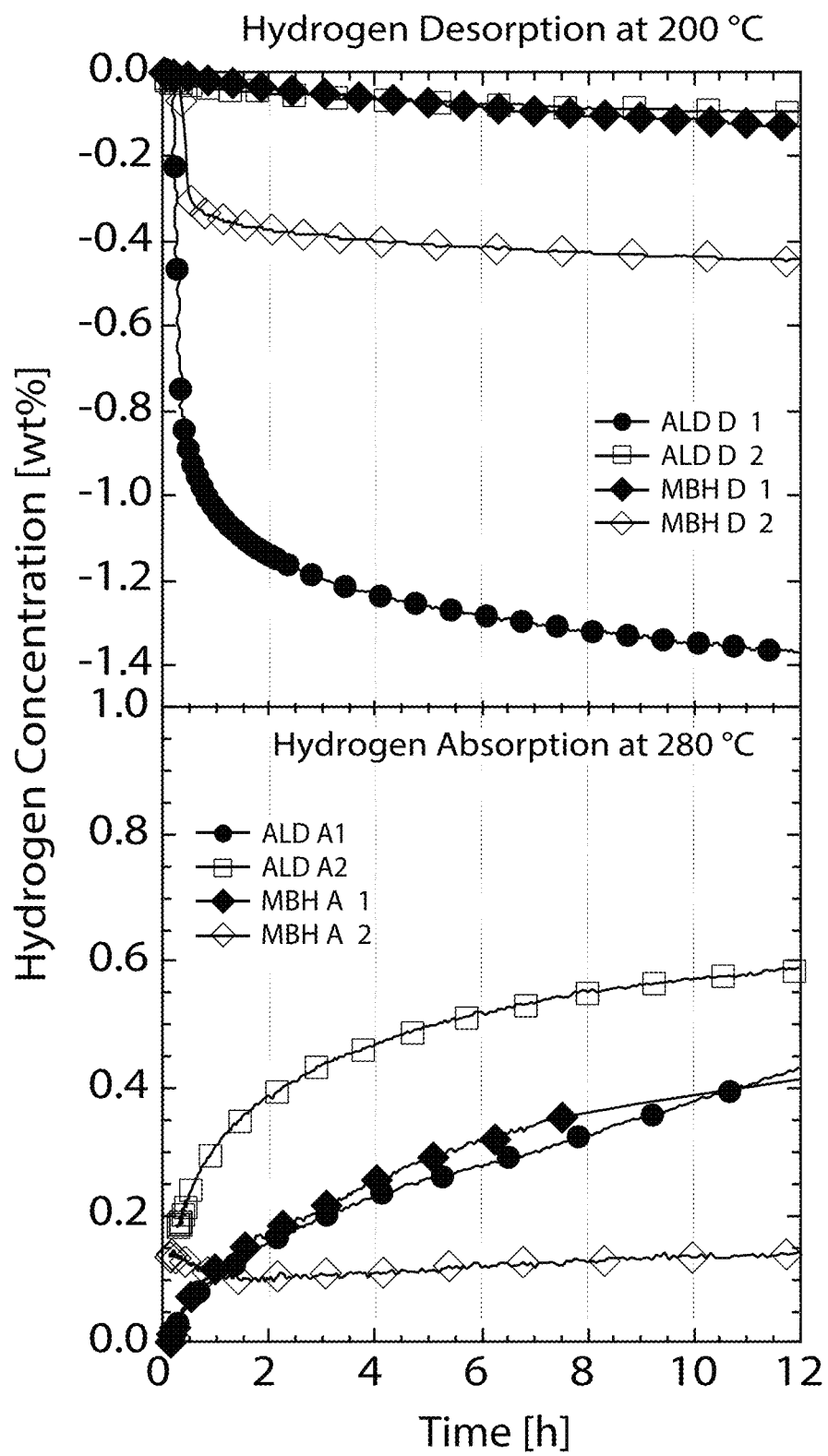
FIG. 8 illustrates desorption and absorption of uncoated $Mg(BH_4)_2$ solid core particles and $Mg(BH_4)_2$ coated with 100 cycles of $Al_2O_3$, according to some embodiments of the present disclosure.

Hydrogen desorption and absorption over three cycles has been completed on the coated (100 cycles $Al_2O_3$) and uncoated nanostructured $Mg(BH_4)_2$ hydrogen storage materials illustrated in FIG. 6 for the following conditions: desorption (hydrogen releasing) at 200° C., vacuum, 24 hours; absorption (hydrogen loading) at 280° C., 120 bar $H_2$, 24 hours. The desorption and re-absorption measurements were performed on a PCTPro-2000 manometric instrument following a complete calibration and validation measurements of the instrument. Sample sizes were 0.3786 grams for the uncoated solid core material and 0.5884 grams for the coated solid core materials. The data was not corrected for the inactive weight which is between 25-50%. FIG. 8 illustrates the desorption and absorption data obtained for these experiments where the desorption and absorption number is denoted with 'D' or 'A' respectively (e.g. Desorption 1, D1). The desorption/absorption sequence was: Desorption 1 (D1), Absorption 1, (A1), Desorption 2 (D2), Absorption 2 (A2). Table 2 summarizes the $H_2$ concentration at 24 hours for each cycle.

TABLE 2

$Mg(BH_4)_2$ coated with 100 cycles of $Al_2O_3$; wt % H2 at 24 hours

| cycle | uncoated | coated |
| --- | --- | --- |
| Desorption: 1 (D1) | −0.19 | −1.42 |
| 2 (D2) | −0.48 | −0.11 |

TABLE 2-continued

Mg(BH$_4$)$_2$ coated with 100 cycles of Al$_2$O$_3$; wt % H2 at 24 hours

| cycle | uncoated | coated |
|---|---|---|
| Absorption: 1 (A1) | 0.66 | 0.61 |
| 2 (A2) | 0.15 | 0.63 |

Kinetics data are presented herein as the weight percent (wt %) of hydrogen released or absorbed (on a sample weight basis) as a function of time. To obtain a more in-depth analysis of the kinetics property changes on coating the Mg(BH$_4$)$_2$ powders desorption measurements were performed at several different temperatures during a single desorption. The sample temperature was increased to the next temperature step after enough data had been collected to determine a stable rate of desorption. The raw data was then fit with a double exponential of the form shown in equation (1) at each temperature step.

$$y = y_0 + A_1 e^{-(x-x_0)/\tau_1} + A_2 e^{-(x-x_0)/\tau_2} \quad (1)$$

Figure 9:
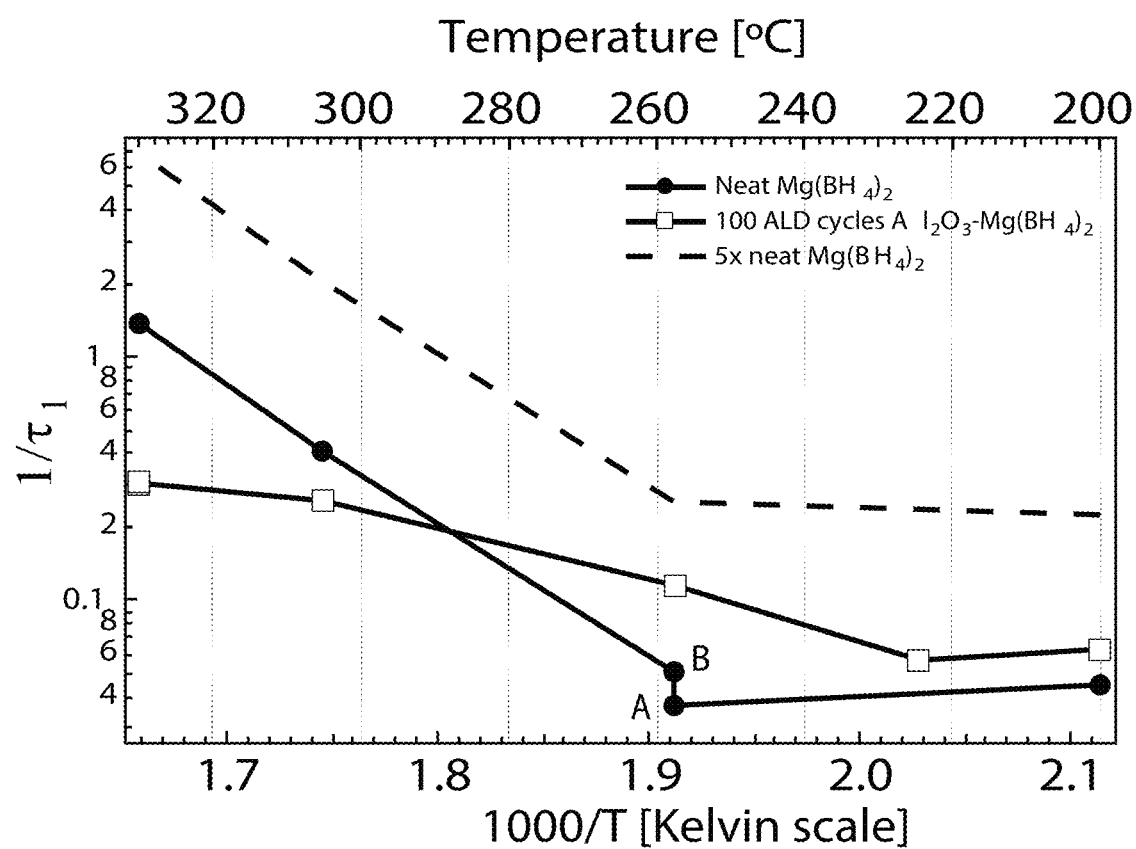
FIG. 9 illustrates an Arrhenius Plot comparing hydrogen desorption kinetics of uncoated $Mg(BH_4)_2$ solid core powder materials and $Mg(BH_4)_2$ solid core powder samples coated with $Mg(BH_4)_2$ by ALD, according to some embodiments of the present disclosure.

The inverse of the first exponential factor $\tau_1$ can be taken as a measure of relative rates of desorption for the two different samples at each temperature. This assumes a first order rate reaction. An Arrhenius plot of the $\ln(1/\tau_1)$ vs. 1000/T [K] is presented in FIG. 9 to compare kinetics for the two materials. Also included in the plot is the target of 5× kinetics of neat MBH and projected rates of ALD coated MBH on an active material basis.

A few different observations can be made. First, most of the data aligns in a linear fashion as one would expect for a chemical decomposition reaction. Arrhenius analysis projects that the slope of these curves are proportional to the activation energy of the reactions. It can be noted that the slopes of the uncoated and coated Arrhenius plots are different, indicating that the ALD coatings have an effect on the activation energy of the desorption process. Second, the desorption rates at the lowest temperature 200° C. do not align with the slope of the data at other temperatures for both samples. This may indicate a change in the desorption process occurring in the temperature range between 200-250° C. Data was collected at 220° C. for the coated sample because of this change in slope that was observed on the initial measurements on the uncoated sample. Third, at temperatures below about 280° C., the desorption rates are between 1.4× and 2× greater than neat Mg(BH$_4$)$_2$ (abbreviated MBH in the figures). Fourth, the rate of the reaction is proportional to the weight of hydrogen desorbed. The data presented is on a weight percent of hydrogen on a sample weight basis. If one considers that the coated sample has additional inactive material mass due to the Al$_2$O$_3$ coating and perhaps additional deactivation or oxidation of the active Mg(BH$_4$)$_2$. Sixth, if one considers that the coated sample has additional inactive material mass due to the Al$_2$O$_3$ coating and perhaps additional deactivation or oxidation of the active Mg(BH$_4$)$_2$ material the actual intrinsic reaction rates will be higher. On this basis we compared the final amount of hydrogen desorbed from the two samples (~9 wt. % uncoated and ~4.5 wt. % coated) and estimated that about half of the weight of the 100 cycle coated material is the inactive material (coatings+deactivated Mg(BH$_4$)$_2$). For this reason, we also plot in FIG. 9 the projected rates of the coated material times a factor of 2 based on our assessment of the inactive mass. This gives an approximation of the true intrinsic rates of hydrogen desorption from the 100-cycle coated Mg(BH$_4$)$_2$ material. In this case the relative rates of desorption are considerably higher for the coated than the uncoated Mg(BH$_4$)$_2$ samples (about 5× at 250° C. and 3× at 200° C.). Finally, because higher desorption temperatures were explored beyond the 24 hour window, improved absorption may result by maintaining the 200° C. desorption cycles.

Temperature programed desorption (TPD) was used select the ALD Al$_2$O$_3$ coated hydrogen storage materials described above. The storage materials having ALD-applied coatings demonstrated improved hydrogen desorption for Mg(BH$_4$)$_2$ for temperatures up to 250° C. The improved performance includes a reduced desorption onset temperature (~140° C.), an increased rate of hydrogen desorbed, and increased release of hydrogen on a MBH weight basis. Table 3 below summarizes the temperature programmed desorption as a function of temperature, time, and time-integrated signal for a thickness series of Al$_2$O$_3$: 3, 10, 50, 100 cycles. As a reference, ALD of Al$_2$O$_3$ grows at 0.11 nm/cycle on flat substrates and the physical characterization will be discussed below. The data show that with increasing ALD cycles, the temperature onset of desorption becomes better defined near 140° C. and quantity of hydrogen released increases. The time-integrated signal data show an increased rate of hydrogen desorbed for increased ALD cycles as well as an increased quantity of hydrogen released. Three cycles of Al$_2$O$_3$ deposition more than doubled the integrated H$_2$ signal compared to the uncoated Mg(BH$_4$)$_2$ solid core particles.

TABLE 3

Hydrogen released as a function of ALD cycles

| Storage material | Wt % H2 at 30 min |
|---|---|
| uncoated Mg(BH$_4$)$_2$ | −0.23 |
| 3 cycles ALD applied Al$_2$O$_3$ onto Mg(BH$_4$)$_2$ | −0.58 |
| 10 cycles | −0.69 |
| 50 cycles | −1.1 |
| 100 cycles | −1.2 |

The effect of heating rate to TPD of coated (100 cycles Al$_2$O$_3$) and uncoated Mg(BH$_4$)$_2$ is summarized in Table 4 below. Increasing the heating rate shifted the onset temperature from 140° C. to 180° C. and increases the hydrogen released. The time-integrated H$_2$ signal for neat MBH to be similar for 15° C./min, 25° C./min, and 35° C./min heating rates and slightly higher for 45° C./min. For ALD coated MBH, the integrated H$_2$ signals are higher than uncoated material and have slightly more scatter in magnitude.

TABLE 4

Hydrogen released as a function of heating rate

| Wt % H2 at 30 min | Neat Mg(BH$_4$)$_2$ | 100 cycles Al$_2$O$_3$—Mg(BH$_4$)$_2$ |
|---|---|---|
| 15° C./min | −0.80 | −1.3 |
| 25° C./min | −0.79 | −1.9 |
| 35° C./min | −0.65 | −1.8 |
| 45° C./min | −0.94 | −1.4 |

Figure 10:
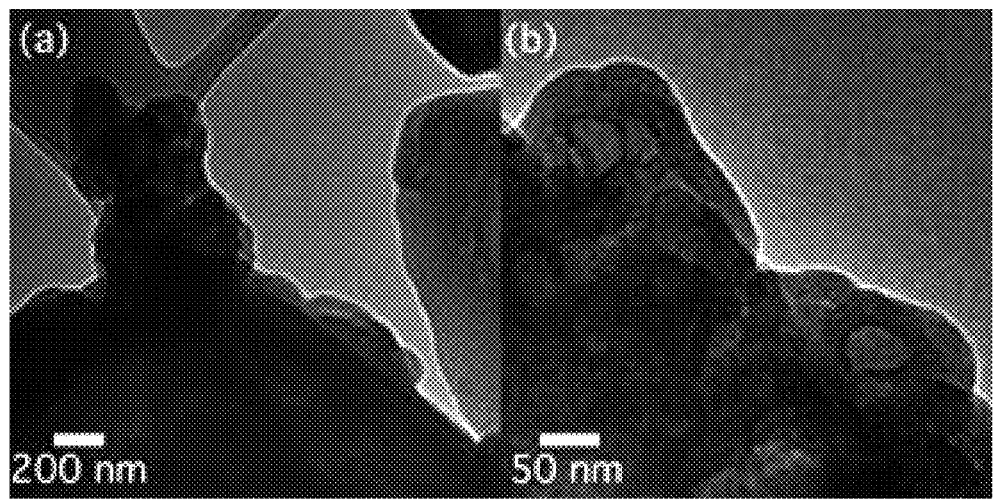
FIG. 10 illustrates a TEM image of a hydrogen storage material constructed of a $Mg(BH_4)_2$ solid core and having a coating layer of $Al_2O_3$ deposited by 100 cycles of ALD on the solid core, after completing three reversible cycles of hydrogen absorption/adsorption, according to some embodiments of the present disclosure.

TEM imaging was performed to gain knowledge about the morphology and composition of the hydrogen storage material example of Al$_2$O$_3$—Mg(BH$_4$)$_2$. morphology and the composition of the architecture is crucial to the success of this project. Referring again to FIG. 6, a few observations can be made. Chains of coated storage material particles are visible. The coating layers covering the solid cores are conformal with no evidence of pinholes and shows a bimodal growth mechanism: small solid cores are first encapsulated in a conformal shell much like a pearl in an oyster; whereupon, the 'pearls' form chains presumably by ALD at contact points. The core-shell structure is retained after the hydrogen desorption/absorption. FIG. 10 shows the TEM of the hydrogen storage material constructed of $Mg(BH_4)_2$ solid core and having an $Al_2O_3$ coating resulting from 100 ALD cycles, after three cycles of reversible hydrogen absorption/desorption. Compared to the material shown in FIG. 6, the material has undergone changes, mainly aggregation of chains of individual particles of the storage material (see Panel a of FIG. 10). The coated solid core architecture has remained intact (see Panel b of FIG. 10).

Figure 11:
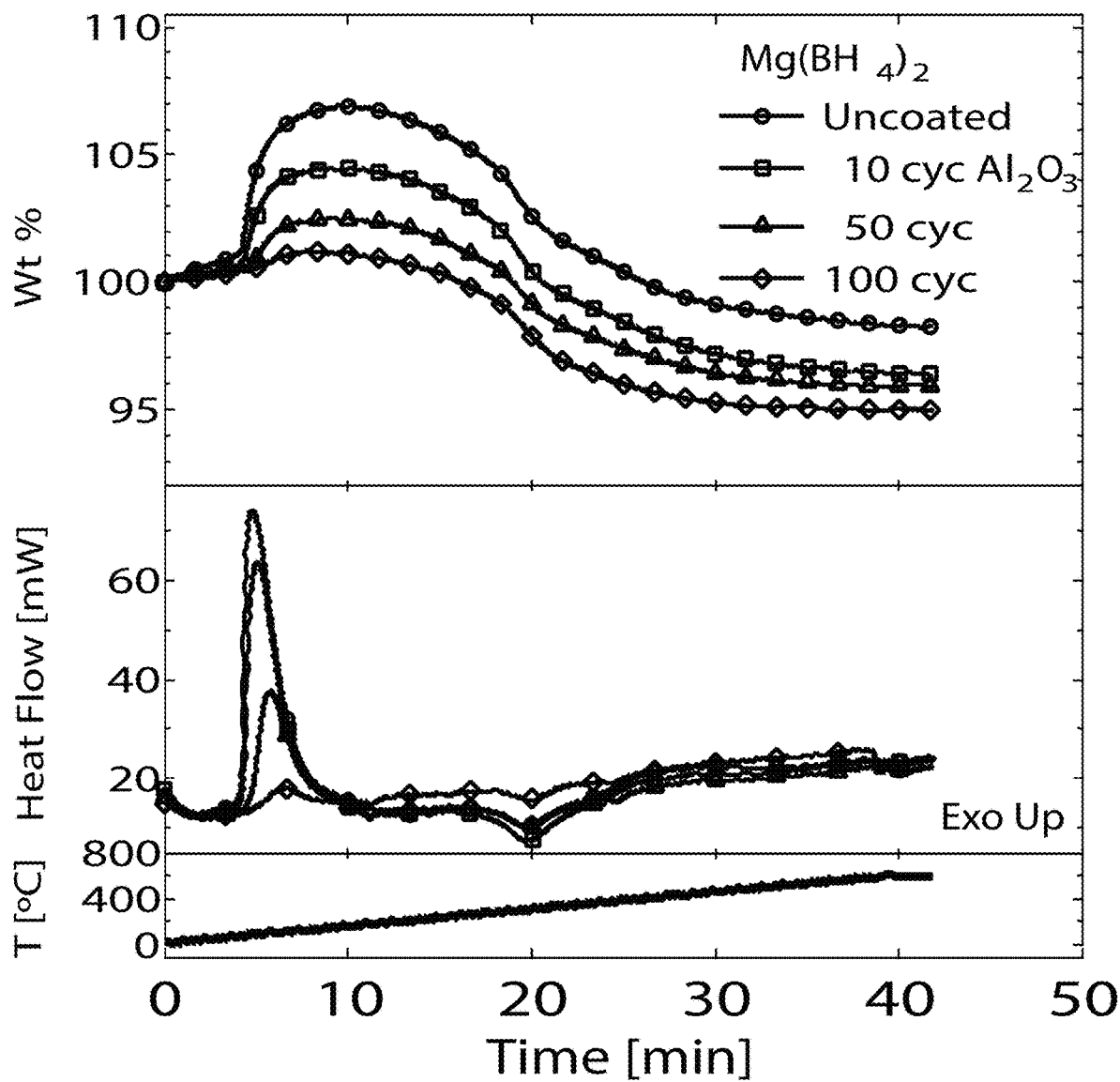
FIG. 11 illustrates TGA data for uncoated $Mg(BH_4)_2$ solid core particles and $Mg(BH_4)_2$ solid core particles coated with $Al_2O_3$ by 3, 10, 50, 100 cycles of ALD deposition.

The encapsulating layers may act as barriers against degradation of the storage material in the presence of air, oxygen, and/or moisture. Thermal gravimetric analysis (TGA) was performed in the presence of trace amounts of oxygen. FIG. 11 shows the TGA data for neat $Mg(BH4)2$ and $Al_2O_3$—$Mg(BH_4)_2$ for 3, 10, 50, 100 cycles. In the top portion of FIG. 6, the mass increase is reduced for materials with more ALD cycles. The mass increase is due to oxygen uptake via oxidation of the storage material. The thicker ALD coatings show a resistance to the mass uptake due to oxygen suggesting the coating acts as a protective barrier to external attack. This reduces the materials handling requirements to maintain a high materials integrity.

A storage material encapsulated with a protective coating that allows handling and transport in ambient conditions may be used as a solid fuel source for combustion, combustion additive, energetic material, or propellant.

Materials and Methods:

The hydrogen storage materials: 1% Pd/activated carbon and magnesium borohydride were obtained from third parties.

Atomic layer deposition. The substrate materials were in powder form and were loaded into an ALD reactor in a metal bottomed tray and a stainless-steel mesh top. ALD was performed at a viscous flow pressure regime (approximately 1 Torr) maintained by a mechanical vacuum pump and constant flow of a carrier gas at rates between 80-900 standard cubic centimeters per second (sccm). Unless otherwise noted, the carrier gas was ultra-high purity nitrogen (99.99999%). Two different ALD reactors were used: 1) A commercial Beneq TFS 200 system (TFS 200); 2) Custom built in house system based on a design by Elam et al. (NREL Rotary).

ALD of $Al_2O_3$ coating layers onto palladium and/or palladium-containing solid cores (1% Pd/a-C or Pd powder ~250 nm size) was performed at 200° C. using trimethylaluminum (TMA) and water. In all cases, TMA and $H_2O$ were held at a constant temperature of 20° C. and were pulsed directly off of their own vapor pressure into the reactor. One half cycle consisted of dosing the sample with the precursor (dose), exposure (soak) of the sample with the precursor isolated from the pump, a purge at higher flow rates. These steps were followed for both TMA and $H_2O$. The powder was loaded into the Rotary NREL reactor in 30 mg batches where 1, 3, 5, 10, 50 ALD cycles were performed. Table 5 provides the time and flow rate (mass flow controller, MFC) for this ALD process.

TABLE 5

ALD of $Al_2O_3$ on palladium supported on activated carbon or pure palladium

| | TMA | | | $H_2O$ | | |
|---|---|---|---|---|---|---|
| | Dose | Soak | Purge | Dose | Soak | Purge |
| | | | Time (s) | | | |
| | 10 | 30 | 30 | 10 | 300 | 300 |
| MFC 1 (sccm) | 20 | 5 | 20 | 20 | 5 | 20 |
| MFC 2 | 20 | 5 | 20 | 20 | 5 | 20 |
| MFC 3 | 20 | 5 | 20 | 20 | 5 | 20 |
| MFC 4 | 20 | 5 | 20 | 20 | 5 | 20 |

ALD of $Al_2O_3$ coating layers onto magnesium diboride ($MgB_2$) solid cores was performed at 150° C. using trimethylaluminum (TMA) and water. $MgB_2$ was obtained from Sigma Aldrich. Approximately 100 mg was coated with 5 ALD cycles where Table 6 provides the time and flow rate (mass flow controller, MFC) for this ALD process.

TABLE 6

ALD of $Al_2O_3$ on $MgB_2$

| | TMA | | | $H_2O$ | | |
|---|---|---|---|---|---|---|
| | Dose | Soak | Purge | Dose | Soak | Purge |
| | | | Time (s) | | | |
| | 10 | 30 | 30 | 10 | 300 | 300 |
| MFC 1 (sccm) | 20 | 5 | 20 | 20 | 5 | 20 |
| MFC 2 | 20 | 5 | 20 | 20 | 5 | 20 |
| MFC 3 | 20 | 5 | 20 | 20 | 5 | 20 |
| MFC 4 | 20 | 5 | 20 | 20 | 5 | 20 |

ALD of $CeO_2$ coating layers onto magnesium diboride solid cores was performed in several ways, first using tetrakis(2,2,6,6-tetramethyl-3,5-heptanedionato) cerium (IV) (Ce-thd$_2$) and oxygen plasma. The process was performed in the Beneq TFS 200 at 250° C. with ultra-high purity argon as the carrier gas (99.99999%) and Ce-thd2 at 200° C. Radio frequency (RF) power at 14.75 MHz and 200 W was used to produce oxygen plasma from oxygen gas (99.999%). The $CeO_2$ growth rate for this process was measured to be 0.018 nm per ALD cycles. Approximately 100 mg of $MgB_2$ was coated with 10 ALD cycles. Table 7 summarizes the sequence timing and flow rates.

TABLE 7

ALD of $CeO_2$ on $MgB_2$

| | Ce-thd$_2$ | | Oxygen plasma | |
|---|---|---|---|---|
| | Dose | Purge | Dose | Purge |
| Time (s) | 1.5 | 2 | 2 | 10 |
| MFC 1 (sccm) | 200 | 200 | 200 | 200 |
| MFC 2 | 600 | 600 | 600 | 600 |
| MFC 3 | 100 | 100 | 100 | 100 |

ALD of $CeO_2$ coating layers onto magnesium diboride solid cores was also performed using Ce-LINE and water. "Ce-LINE" is the tradename for a cerium ALD precursor supplied by Air Liquide. The process was performed in the Beneq TFS 200 at 150° C. and Ce-LINE at 140° C. Table 8 provides the sequence timing and flow rates. Approximately 100 mg of $MgB_2$ was coated with 300 ALD cycles.

TABLE 8

| ALD of CeO$_2$ on MgB$_2$ (using Ce-LINE) | | | | |
|---|---|---|---|---|
| | Ce-LINE | | H$_2$O | |
| | Dose | Purge | Dose | Purge |
| Time (s) | 63 | 4 | 3 | 60 |
| MFC 1 (sccm) | 200 | 200 | 200 | 200 |
| MFC 2 | 300 | 300 | 300 | 300 |

ALD of CeO$_2$ coating layers onto magnesium diboride solid cores was also performed using tris(isopropyl-cyclopentadienyl) cerium (III) (Ce-(iPrCp)$_3$) and water. The process was performed in the Beneq TFS 200 at 220° C. and Ce-(iPrCp)3 at 160° C. Approximately 100 mg of MgB$_2$ was coated with 150 ALD cycles. This yielded a CeO$_2$ loading of 1.6 wt % using the ICP method. Table 9 provides the sequence timing and flow rates.

TABLE 9

| ALD of CeO$_2$ on MgB$_2$ (using Ce (III)) | | | | |
|---|---|---|---|---|
| | Ce-(iPrCp)3 | | H$_2$O | |
| | Dose | Purge | Dose | Purge |
| Time (s) | 2 | 1.5 | 0.15 | 4 |
| MFC 1 (sccm) | 200 | 200 | 200 | 200 |
| MFC 2 | 300 | 600 | 600 | 600 |

ALD of Al$_2$O$_3$ coating layers onto Mg(BH$_4$)$_2$ solid cores using trimethylaluminum and water. The ALD was performed at 40° C. in the Beneq TFS 200. The Beneq TFS 200 was directly interfaced with an environmentally controlled glovebox that enabled sample transfer without exposure to the ambient environment. The glovebox was maintained with high purity nitrogen (99.999%) with an average oxygen content of 5 ppm or less and water content of 0.1 ppm or less. The storage and transfer of the Mg(BH$_4$) was also maintained under these conditions. Approximately 100 mg of Mg(BH$_4$) was loaded in to the Beneq TFS 200 reactor where 3, 10, 20, 50, and 100 ALD cycles were performed. Table 10 provides the timing sequence and flow rates. The mass loadings of the resultant Al$_2$O$_3$ coatings are given in Table 11.

TABLE 10

| ALD of Al$_2$O$_3$ on Mg(BH$_4$)$_2$ | | | | |
|---|---|---|---|---|
| | TMA | | H$_2$O | |
| | Dose | Purge | Dose | Purge |
| Time (s) | 5 | 180 | 5 | 180 |
| MFC 1 (sccm) | 250 | 250 | 250 | 250 |
| MFC 2 | 300 | 300 | 300 | 300 |

TABLE 11

| ALD of Al$_2$O$_3$ on Mg(BH$_4$)$_2$ | |
|---|---|
| ALD Cycles | Wt % Al$_2$O$_3$ |
| 3 | 1.1 |
| 10 | 2.1 |
| 50 | 7.2 |
| 100 | 12.3 |

ALD of TiO$_2$—Al$_2$O$_3$ coating layers onto Mg(BH$_4$)$_2$ solid cores using titanium (IV) chloride (TiCl$_4$), trimethylaluminum and water. The ALD was performed at 40° C. in the Beneq TFS 200. The TiO$_2$—Al$_2$O$_3$ was grown by alternating TiCl$_4$—H$_2$O cycles with TMA-H$_2$O cycles in a 1:1 ratio. Approximately 100 mg of Mg(BH$_4$)$_2$ was loaded in the glovebox and transferred directly (air-free) into the ALD reactor where 40 ALD super cycles of TiO$_2$—Al$_2$O$_3$ were performed. This yielded a coating with 3.9 wt % TiO$_2$ and 5.7 wt % Al2O3 measured by ICP. Table 12 provides the timing sequence and flow rates.

TABLE 12

| ALD of TiO$_2$—Al2O$_3$ on Mg(BH$_4$)$_2$ | | | | | | | | |
|---|---|---|---|---|---|---|---|---|
| | TiCl$_4$ | | H$_2$O | | TMA | | H$_2$O | |
| | Dose | Purge | Dose | Purge | Dose | Purge | Dose | Purge |
| | | | | Time (s) | | | | |
| | 5 | 180 | 5 | 180 | 5 | 180 | 5 | 180 |
| MFC 1 (sccm) | 250 | 250 | 250 | 250 | 250 | 250 | 250 | 250 |
| MFC 2 | 300 | 300 | 300 | 300 | 300 | 300 | 300 | 300 |

EXAMPLES

Example 1

A composition comprising: a solid core having an outer surface; and a coating layer, wherein: the coating layer covers at least a portion of the outer surface, the coating layer is permeable to hydrogen (H$_2$), and the solid core is capable of reversibly absorbing and desorbing hydrogen.

Example 2

The composition of Example 1, wherein the solid core has a characteristic diameter between greater than zero nanometers and 5000 nm.

Example 3

The composition of Example 2, wherein the characteristic diameter is between 1 nm and 50 nm, inclusively.

Example 4

The composition of Example 1, wherein the solid core has a shape comprising at least one of a spherical shape, cylindrical shape, or an amorphous particulate shape.

Example 5

The composition of Example 1, wherein the solid core comprises at least one of a hydride or a metal.

Example 6

The composition of Example 5, wherein the metal comprises at least one of palladium, platinum, nickel, iridium, ruthenium, copper, silver, gold, or osmium.

Example 7

The composition of Example 5, wherein: the solid core further comprises a substrate, and the metal is positioned on the substrate.

Example 8

The composition of Example 7, wherein the substrate comprises at least one of activated carbon, aluminum oxide, silicon dioxide, or magnesium diboride.

Example 9

The composition of Example 8, wherein the substrate is activated carbon.

Example 10

The composition of Example 7, wherein the metal is palladium.

Example 11

The composition of Example 7, wherein the metal has a characteristic length between 1 nm and 50 nm.

Example 12

The composition of Example 5, wherein the hydride comprises the metal.

Example 13

The composition of Example 12, wherein the hydride comprises at least one of magnesium hydride ($MgH_2$), $TiH_2$, aluminum hydride ($AlH_3$), lanthanum nickel hydride ($LaNi_5H_7$), or lithium aluminum hydride ($LiAlH_4$).

Example 14

The composition of Example 5, wherein the hydride comprises boron.

Example 15

The composition of Example 14, wherein the hydride comprises at least one of magnesium borohydride ($Mg(BH_4)_2$), ammonia borane ($NH_3BH_3$), aluminum borohydride ($Al(BH_4)_2$), calcium borohydride ($Ca(BH_4)_2$), magnesium diboride ($MgB_2$), sodium borohydride ($NaBH_4$), or lithium borohydride ($LiBH_4$).

Example 16

The composition of Example 1, wherein the coating layer has a thickness between greater than zero nanometers and 50 nm.

Example 17

The composition of Example 16, wherein the thickness is between 0.1 nm and 10 nm.

Example 18

The composition of Example 16, wherein the coating layer comprises one or more layers deposited by atomic layer deposition (ALD).

Example 19

The composition of Example 18, wherein each layer is deposited sequentially by a cycle of ALD.

Example 20

The composition of Example 18, wherein the cycle of ALD is between 1 cycle and 100 cycles.

Example 22

The composition of Example 1, wherein the coating completely covers the outer surface.

Example 23

The composition of Example 1, wherein the coating covers at least 99% of the outer surface.

Example 24

The composition of Example 1, wherein the coating covers at least 90% of the outer surface.

Example 25

The composition of Example 1, wherein the coating layer comprises at least one of an oxide or a sulfide.

Example 26

The composition of Example 25, wherein the coating layer comprises at least one of MgO, $SnO_2$, $SiO_2$, ZnS, $Al_2O_3$, $CeO_2$, $Nb_2O_5$, $ZrO_2$, $CeO_2$, or $TiO_2$.

Example 27

The composition of Example 25, wherein the coating layer further comprises a metal.

Example 28

The composition of Example 27, wherein the metal comprises at least one of palladium or ruthenium.

Example 29

The composition of Example 27, wherein the metal comprises at least one of palladium, platinum, nickel, iridium, ruthenium, copper, silver, gold, or osmium.

Example 30

The composition of Example 27, wherein the metal is present at a concentration between greater than zero weight percent and 1 wt %.

Example 31

The composition of Example 1, further comprising: a particle, wherein: the particle is positioned on the outer surface, and the coating substantially covers the particle.

Example 32

The composition of Example 31, wherein the coating completely covers the particle.

Example 33

The composition of Example 31, wherein the particle comprises at least one of palladium, platinum, nickel, iridium, ruthenium, copper, silver, gold, or osmium.

Example 34

The composition of Example 31, wherein the particle has a characteristic length between greater than zero nanometers and 10 nm.

Example 35

The composition of Example 34, wherein the characteristic length is between 0.1 nm and 2 nm, inclusively.

Example 36

The composition of Example 31, wherein the particle is present at a concentration between greater than zero weight percent and 1 wt %.

Example 37

The composition of Example 1, wherein: the solid core comprises an activated carbon and palladium, the palladium is in the form of a particle having a characteristic length between 5 nm and 10 nm, the solid core has a characteristic diameter between 50 nm and 500 nm, inclusively, the coating comprises alumina, and the coating has a thickness between 0.1 nm and 1 nm.

Example 38

The composition of Example 1, wherein: the solid core comprises $Mg(BH_4)_2$, the solid core is substantially in the γ-phase, the solid core has a characteristic diameter between 1 nm and 40 nm, inclusively, the coating comprises at least one of alumina or titania, and the coating has a thickness between 0.1 nm and 1 nm.

Example 39

The composition of Example 1, wherein: the solid core comprises $MgB_2$, the solid core has a characteristic diameter between 1 nm and 1000 nm, inclusively, the coating comprises at least one of alumina or ceria, and the coating has a thickness between 0.1 nm and 1 nm.

Example 40

The composition of Example 1, further comprising hydrogen.

Example 41

The composition of Example 40, wherein the hydrogen is present at a concentration between greater than zero weight percent and 10 wt %, inclusively.

Example 42

A method comprising: loading hydrogen ($H_2$) onto a storage material, the storage material comprising: a solid core; and a coating layer; and releasing the hydrogen from the storage material, wherein: the loading and releasing are reversibly cycled between the loading and the releasing, the storage material, after the loading, contains a concentration of the hydrogen of up to 10 wt %, and the storage material, after the releasing, contains a concentration of the hydrogen of less than 10 wt %.

Example 43

The method of Example 42, wherein the storage material is capable of being reversibly cycled between the loading and the releasing at least three times.

Example 44

The method of Example 43, wherein the storage material is capable of being reversibly cycled between the loading and the releasing at least one hundred times.

Example 45

The method of Example 42, wherein the loading is performed at a temperature between 100° C. and 300° C.

Example 46

The method of Example 45, wherein the temperature is between about 190° C. and about 210° C.

Example 47

The method of Example 42, wherein the loading is performed at a pressure between 1 bar and 500 bar.

Example 48

The method of Example 47, wherein the pressure is between 90 bar and 110 bar.

Example 49

The method of Example 42, wherein the loading is completed in a period of time between 1 minute and one hour.

Example 50

The method of Example 49, wherein the period of time is between 5 minutes and 15 minutes.

Example 51

The method of Example 42, wherein the releasing is performed at a temperature between 25° C. and 100° C.

Example 52

The method of Example 51, wherein the temperature is between about 70° C. and about 100° C.

Example 53

The method of Example 42, wherein the releasing is performed at a pressure between 1 bar and 50 bar.

Example 54

The method of Example 53, wherein the pressure is between 8 bar and 10 bar.

Example 55

The method of Example 42, wherein, during the releasing, the hydrogen is released at a rate greater than one gram of hydrogen per second.

Example 56

The method of Example 55, wherein the rate is between 0.01 g/s and 1 g/s.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
   a plurality of particles, wherein each particle comprises:
   a solid core having an outer surface and an average characteristic length between 1 nm and 50 nm, inclusively; and
   a conformal coating layer comprising a metal oxide and having a thickness between 0.1 nm and 10 nm, inclusively, wherein:
   the conformal coating layer is permeable to hydrogen ($H_2$) and substantially non-permeable to molecules other than hydrogen,
   the solid core is capable of reversibly absorbing and desorbing hydrogen, and
   the plurality of particles forms at least one chain of particles.

2. The composition of claim 1, wherein the solid core comprises at least one of a hydride or a metal.

3. The composition of claim 2, wherein the metal comprises at least one of palladium, platinum, nickel, iridium, ruthenium, copper, silver, gold, or osmium.

4. The composition of claim 2, wherein:
   the solid core further comprises a substrate, and
   the metal is positioned on the substrate.

5. The composition of claim 4, wherein the substrate comprises at least one of activated carbon, aluminum oxide, silicon dioxide, or magnesium diboride.

6. The composition of claim 5, wherein the substrate is activated carbon.

7. The composition of claim 6, wherein the metal is palladium.

8. The composition of claim 7, wherein the palladium is present on the substrate at a concentration between about 0.5 wt % and 1.0 wt %.

9. The composition of claim 2, wherein the hydride comprises at least one of magnesium hydride ($MgH_2$), $TiH_2$, aluminum hydride ($AlH_3$), lanthanum nickel hydride ($LaNi_5H_7$), or lithium aluminum hydride ($LiAlH_4$).

10. The composition of claim 2, wherein the hydride comprises boron.

11. The composition of claim 10, wherein the hydride comprises at least one of magnesium borohydride ($Mg(BH_4)_2$), ammonia borane ($NH_3BH_3$), aluminum borohydride ($Al(BH_4)_2$), calcium borohydride ($Ca(BH_4)_2$), magnesium diboride ($MgB_2$), sodium borohydride ($NaBH_4$), or lithium borohydride ($LiBH_4$).

12. The composition of claim 1, wherein the conformal coating layer comprises one or more layers deposited by atomic layer deposition (ALD).

13. The composition of claim 1, wherein the conformal coating layer comprises at least one of MgO, $SnO_2$, $SiO_2$, ZnS, $Al_2O_3$, $CeO_2$, $Nb_2O_5$, $ZrO_2$, $CeO_2$, or $TiO_2$.

14. The composition of claim 1, further comprising:
   a particle, wherein:
   the particle is positioned on the outer surface, and
   the coating substantially covers the particle.

15. The composition of claim 1, further comprising hydrogen.

16. The composition claim 1, wherein the chain of particles comprises at least five particles.

17. The composition of claim 1, wherein the chain of particles has a length of at least 200 nm.

18. A method comprising:
   loading hydrogen ($H_2$) onto a storage material, the storage material comprising:
   a plurality of particles, wherein each particle comprises:
   a solid core having an outer surface and an average characteristic length between 1 nm and 50 nm, inclusively; and
   a conformal coating layer comprising a metal oxide and having a thickness between 0.1 nm and 10 nm, inclusively wherein:
   the conformal coating layer is permeable to hydrogen and substantially non-permeable to molecules other than hydrogen,
   the solid core is capable of reversibly absorbing and desorbing hydrogen, and
   the plurality of particles forms at least one chain of particles,
   releasing the hydrogen from the storage material, wherein:
   the loading and releasing are reversibly cycled between the loading and the releasing, the storage material, after the loading, contains a concentration of the hydrogen of up to 10 wt %, and the storage material, after the releasing, contains a concentration of the hydrogen of less than 10 wt %.

19. The method of claim 18, wherein the storage material is capable of being reversibly cycled between the loading and the releasing at least three times.

20. The method of claim 18, wherein the storage material is capable of being reversibly cycled between the loading and the releasing at least one hundred times.

* * * * *